United States Patent
Son et al.

(10) Patent No.: US 10,566,968 B1
(45) Date of Patent: Feb. 18, 2020

(54) OUTPUT DRIVER, AND SEMICONDUCTOR MEMORY DEVICE AND MEMORY SYSTEM HAVING THE SAME

(71) Applicant: SAMSUNG ELECTRONICS CO., LTD., Suwon-si, Gyeonngi-do (KR)

(72) Inventors: Young Hoon Son, Hwaseong-si (KR); Jung Hwan Choi, Hwaseong-si (KR); Seok Hun Hyun, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/359,029

(22) Filed: Mar. 20, 2019

(30) Foreign Application Priority Data

Aug. 6, 2018 (KR) .......................... 10-2018-0091246

(51) Int. Cl.
    *H03K 17/16*    (2006.01)
    *H03K 19/003*   (2006.01)
    *H03K 17/041*   (2006.01)

(52) U.S. Cl.
    CPC ..... *H03K 17/164* (2013.01); *H03K 17/04106* (2013.01); *H03K 19/00361* (2013.01)

(58) Field of Classification Search
    CPC ........... H03K 17/164; H03K 19/00361; H03K 17/04106
    USPC ......................................................... 326/30
    See application file for complete search history.

(56) References Cited

U.S. PATENT DOCUMENTS

| 5,191,244 A | 3/1993 | Runaldue et al. |
| 5,382,847 A | 1/1995 | Yasuda |
| 5,422,591 A | 6/1995 | Rastegar et al. |
| 5,986,489 A | 11/1999 | Raza et al. |
| 6,356,102 B1 | 3/2002 | Klein et al. |
| 6,509,765 B1 | 1/2003 | Drost |
| 8,824,622 B2 | 9/2014 | Tsuge et al. |
| 10,090,288 B2 * | 10/2018 | Kim ................... H01L 27/0207 |
| 2009/0059712 A1 | 3/2009 | Lee et al. |
| 2011/0205832 A1 * | 8/2011 | Jeon ..................... G11C 7/1057 365/233.16 |

(Continued)

FOREIGN PATENT DOCUMENTS

JP    5853338    4/2012

*Primary Examiner* — Don P Le
(74) *Attorney, Agent, or Firm* — F. Chau & Associates, LLC

(57) ABSTRACT

An output driver includes a pre-driver receiving a driver control code to generate a pull-up control signal or a pull-down control signal in response to data while a read operation is performed, an on-die termination controller receiving a first on-die termination control code to generate a first on-die termination control signal in response to an on-die termination enable signal while a write operation is performed, and a main driver including a pull-up n-channel metal-oxide-semiconductor (NMOS) driver generating high-level output data in response to the pull-up control signal while the read operation is performed, and terminating high-level input data with a first high voltage and terminating low-level input data with a first low voltage in response to the first on-die termination control signal while the write operation is performed, and a pull-down NMOS driver generating low-level output data in response to the pull-down control signal while the read operation is performed.

19 Claims, 14 Drawing Sheets

(56) References Cited

U.S. PATENT DOCUMENTS

| | | | |
|---|---|---|---|
| 2013/0194001 A1* | 8/2013 | Lee | H03K 19/0005 326/30 |
| 2014/0292390 A1* | 10/2014 | Baek | G11C 7/1069 327/160 |
| 2016/0094202 A1* | 3/2016 | Hollis | H03K 3/011 327/109 |
| 2016/0218713 A1* | 7/2016 | Oh | H03K 19/0013 |

* cited by examiner

FIG. 12

| COM | CSB | CA | | | | | | | CK (M1) |
|---|---|---|---|---|---|---|---|---|---|
| | | CA1 | CA2 | CA3 | CA4 | CA5 | CA6 | CAr | |
| ACTIVATE | L | L | L | | | | | | 1↑ |
| | X | | | | | | | | 2↑ |
| WRITE | L | H | L | H | H | L | | I | 1↑ |
| | H | | | | | | | II | 2↑ |
| NT_WRITE | L | H | L | H | H | L | | X | 1↑ |
| | L | | | | | | | X | 2↑ |
| READ | L | H | L | H | H | H | | II | 1↑ |
| | H | | | | | | | II | 2↑ |
| NT_READ | L | H | L | H | H | H | | X | 1↑ |
| | L | | | | | | | X | 2↑ |
| MODE REGISTER SET | L | H | L | H | L | L | | III | 1↑ |
| | H | | | | | | | III | 2↑ |

OUTPUT DRIVER, AND SEMICONDUCTOR MEMORY DEVICE AND MEMORY SYSTEM HAVING THE SAME

CROSS-REFERENCE TO RELATED APPLICATION

This application claims priority under 35 U.S.C. § 119 to Korean Patent Application No. 10-2018-0091246, filed on Aug. 6, 2018 in the Korean Intellectual Property Office, the disclosure of which is incorporated by reference herein in its entirety.

TECHNICAL FIELD

Exemplary embodiments of the inventive concept relate to an output driver, and a semiconductor memory device and a memory system having the same.

DISCUSSION OF RELATED ART

A memory system may include a semiconductor memory device and a memory controller. The semiconductor memory device and the memory controller may receive or output data using a low-voltage swing-terminated logic (LVSTL) input-and-output (IO) interface. According to the LVSTL IO interface, when each of the semiconductor memory device and the memory controller outputs data, each of the semiconductor memory device and the memory controller may generate output data using an output driver which includes a pull-up n-channel metal-oxide-semiconductor (NMOS) driver for driving high-level data and a pull-down NMOS driver for driving low-level data.

SUMMARY

According to an exemplary embodiment of the inventive concept, an output driver includes a pre-driver configured to receive a driver control code to generate a pull-up control signal or a pull-down control signal in response to data while a read operation is performed, an on-die termination controller configured to receive a first on-die termination control code to generate a first on-die termination control signal in response to an on-die termination enable signal while a write operation is performed, and a main driver including a pull-up n-channel metal-oxide-semiconductor (NMOS) driver, and a pull-down NMOS driver. The pull-up NMOS driver is configured to generate high-level output data in response to the pull-up control signal while the read operation is performed, and configured to terminate high-level input data with a first high voltage which is lower than or equal to an output power supply voltage and terminate low-level input data with a first low voltage between the first high voltage and a ground voltage, in response to the first on-die termination control signal while the write operation is performed. The pull-down NMOS driver is configured to generate low-level output data in response to the pull-down control signal while the read operation is performed.

According to an exemplary embodiment of the inventive concept, a semiconductor memory device includes a command and address generator configured to decode an inverted chip selection signal and a command signal included in a command and address to generate a write command or a read command, and generate an address signal included in the command and address as a row address or a column address, a latency control signal generator configured to generate an on-die termination enable signal, which is activated using a value of a write latency and inactivated using the value of the write latency and a value of a burst length in response to the write command, and generate a read control signal, which is activated using a value of a read latency and inactivated using the value of the read latency and the value of the burst length in response to the read command, a memory cell array including a plurality of memory cells and configured to receive or output data from/to memory cells selected in response to the row address and the column address, an on-die termination controller configured to receive a first on-die termination control code to generate a first on-die termination control signal in response to the write command and the on-die termination enable signal, a pre-driver configured to be enabled in response to the read control signal and generate a driver control code as a pull-up control signal or a pull-down control signal in response to data which is output from the memory cell array, and a main driver including a pull-up NMOS driver and a pull-down NMOS driver. The pull-up NMOS driver is configured to generate high-level output data in response to the pull-up control signal, or terminate high-level input data with a first high voltage which is lower than or equal to an output power supply voltage and terminate low-level input data with a first low voltage between the first high voltage and a ground voltage, in response to the first on-die termination control signal. The pull-down NMOS driver is configured to generate low-level output data in response to the pull-down control signal.

According to an exemplary embodiment of the inventive concept, a memory system includes a first inverted chip selection signal line, a second inverted chip selection signal line, a command and address line, and a data line configured to transmit a first inverted chip selection signal lie, a second inverted chip selection signal, a command and address, and data, respectively, a first memory configured to receive the first inverted chip selection signal and the command and address, and receive or output the data, and a second memory configured to receive or output the second inverted chip selection signal, the command and address, and the data. Each of the first memory and the second memory includes a command and address generator configured to decode the first inverted chip selection signal or the second inverted chip selection signal and a command signal included in the command and address to generate a write command or a read command, and generate an address signal included in the command and address as a row address or a column address, a latency control signal generator configured to generate an on-die termination enable signal, which is activated using a value of a write latency and inactivated using the value of the write latency and a value of a burst length in response to the write command, and generate a read control signal, which is activated using a value of a read latency and inactivated using the value of the read latency and the value of the burst length in response to the read command, a memory cell array including a plurality of memory cells and configured to receive or output data from/to memory cells selected in response to the row address and the column address, an on-die termination controller configured to receive a first on-die termination control code to generate a first on-die termination control signal in response to the write command and the on-die termination enable signal, a pre-driver configured to be enabled in response to the read control signal and receive a driver control code to generate a pull-up control signal or a pull-down control signal in response to data which is output from the memory cell array, and a main driver including a pull-up NMOS driver and a pull-down NMOS driver. The pull-up NMOS driver is configured to generate high-level output data in response to the pull-up control signal, or terminate high-level input data with a first high voltage which is lower than or equal to an output power supply voltage and terminate low-level input data with a first low voltage between the first high voltage and a ground voltage, in response to the first on-die termination control signal. The pull-down NMOS driver is configured to generate low-level output data in response to the pull-down control signal.

BRIEF DESCRIPTION OF THE DRAWINGS

FIG. 12 shows a command truth table of a command and address which is applied from a controller to a first memory and a second memory in FIG. 11 according to an exemplary embodiment of the inventive concept.

DETAILED DESCRIPTION OF THE EXEMPLARY EMBODIMENTS

Figure 1:
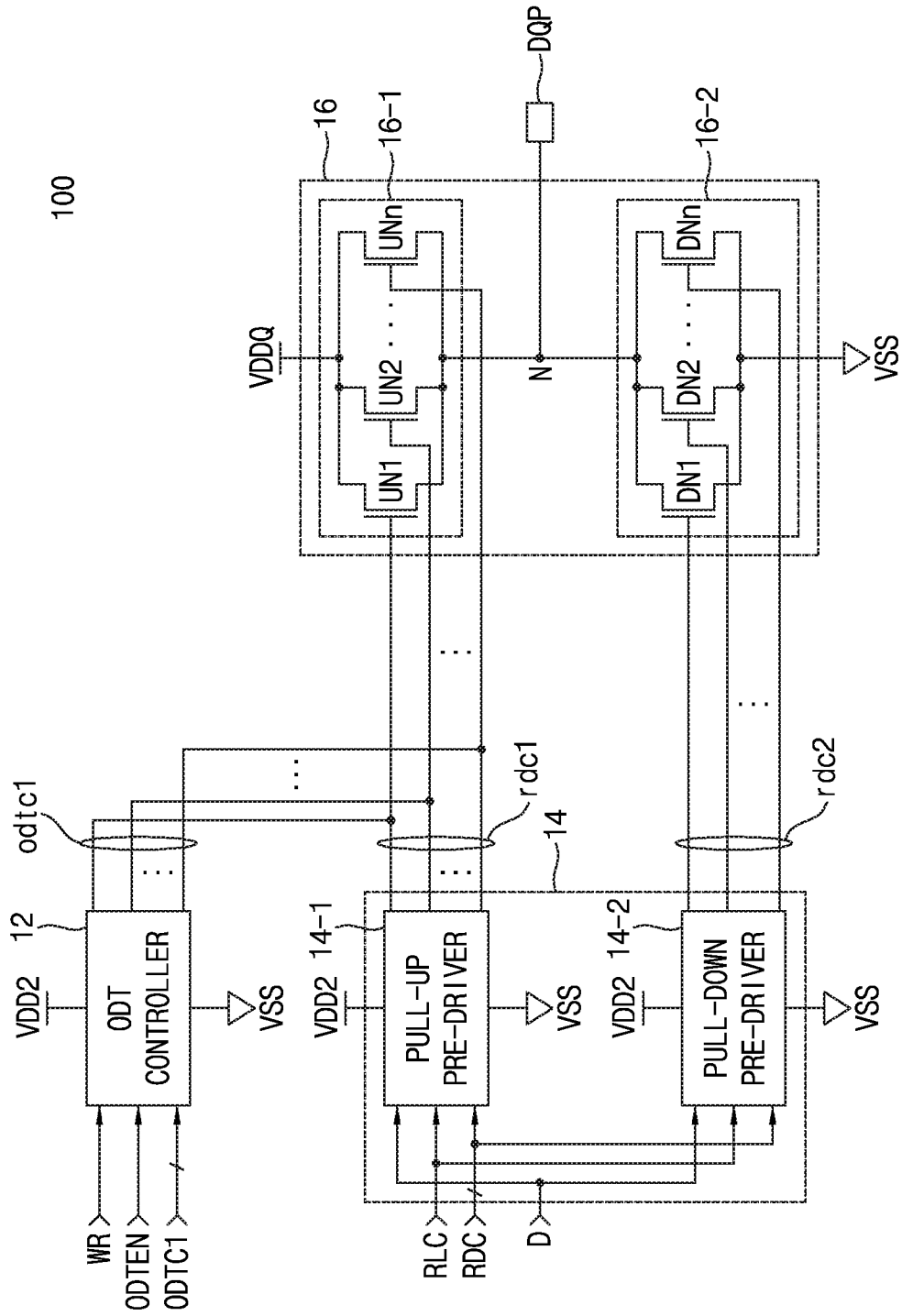
FIG. 1 is a diagram showing an output driver according to an exemplary embodiment of the inventive concept.

Exemplary embodiments of the inventive concept are directed to providing an output driver capable of effectively terminating input data when the output driver includes a pull-up n-channel metal-oxide-semiconductor (NMOS) driver and a pull-down NMOS driver, and a semiconductor memory device and a memory system having the same.

Hereinafter, an output driver, and a semiconductor memory device and a memory system having the same according to exemplary embodiments of the inventive concept will be described with reference to the accompanying drawings. Like reference numerals may refer to like elements throughout this application.

Figure 2:
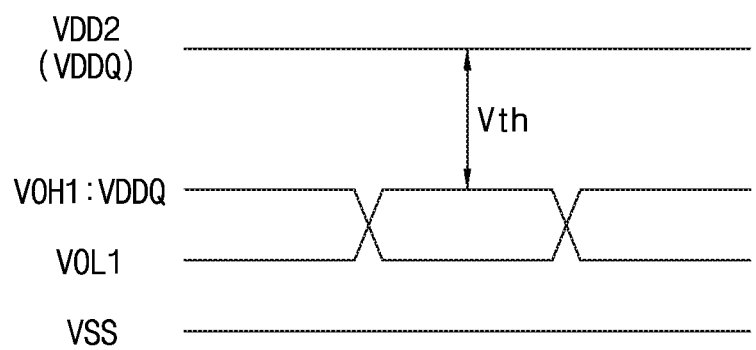
FIG. 2 shows a first high voltage and a first low voltage during a pull-up on-die termination operation according to an exemplary embodiment of the inventive concept.

FIG. 1 is a diagram showing an output driver according to an exemplary embodiment of the inventive concept. FIG. 2 shows a first high voltage and a first low voltage during a pull-up on-die termination operation according to an exemplary embodiment of the inventive concept.

An output driver 100 may include an on-die termination (ODT) controller 12, a pull-up pre-driver 14-1, a pull-down pre-driver 14-2, and a main driver 16. The main driver 16 may include a pull-up n-channel metal-oxide-semiconductor (NMOS) driver 16-1 and a pull-down NMOS driver 16-2. The pull-up NMOS driver 16-1 may include n NMOS transistors UN1 to UNn connected in parallel between an output power supply voltage VDDQ and a node N, and the pull-down NMOS driver 16-2 may include n NMOS transistors DN1 to DNn connected in parallel between the node N and a ground voltage VSS.

Further, an internal power supply voltage VDD2, which is applied to the ODT controller 12, the pull-up pre-driver 14-1, and the pull-down pre-driver 14-2, may be higher than or equal to the output power supply voltage VDDQ which is applied to the pull-up NMOS driver 16-1. For example, when the output power supply voltage VDDQ is 1 V, the internal power supply voltage VDD2 may be 1 V. Accordingly, a "high" level of a pull-up control signal rdc1 may be 1 V. As another example, when the output power supply voltage VDDQ is 0.5 V, the internal power supply voltage VDD2 may be 1 V. The ground voltage VSS, which is applied to the ODT controller 12, the pull-up pre-driver 14-1, the pull-down pre-driver 14-2, and the pull-down NMOS driver 16-2, may be substantially equal to each other.

Functions of the blocks shown in FIG. 1 will be described hereinafter.

The ODT controller 12 may receive a first ODT control code ODTC1 to generate a first ODT control signal odtc1 in response to a write command WR and an ODT enable signal ODTEN while a write operation is performed. For example, the first ODT control signal odtc1 may be n-bit data.

The pull-up pre-driver 14-1 may be enabled in response to a read control signal RLC while a read operation is performed, and may generate some bits of a driver control code RDC as the pull-up control signal rdc1 when data D is high-level data. For example, when the driver control code RDC is 2n-bit data, the pull-up pre-driver 14-1 may generate upper n-bit data of the 2n-bit data as the pull-up control signal rdc1.

The pull-down pre-driver 14-2 may be enabled in response to the read control signal RLC while the read operation is performed, and may generate the remaining bits of the driver control code RDC as a pull-down control signal rdc2 when the data D is low-level data. For example, when the driver control code RDC is 2n-bit data, the pull-down pre-driver 14-2 may generate lower n-bit data of the 2n-bit data as the pull-down control signal rdc2.

The NMOS transistors UN1 to UNn may be turned on or off in response to the pull-up control signal rdc1. For example, when each bit of the n-bit pull-up control signal rdc1 is a high-level bit, each of the NMOS transistors UN1 to UNn may be turned on to generate high-level data from a data terminal DQP. In this case, when the number of turned-on NMOS transistors UN1 to UNn is large, the number of resistors connected in parallel may be increased, so that a resistance value of the pull-up NMOS driver 16-1 may be reduced. Therefore, the driving ability of the pull-up NMOS driver 16-1 may be increased.

Further, each of the NMOS transistors UN1 to UNn may be turned on or off in response to each bit of the n-bit first ODT control signal odtc1, so that the resistance value of the pull-up NMOS driver 16-1 may be determined and the NMOS transistors UN1 to UNn may be used as a pull-up ODT resistor. For example, when the NMOS transistors UN1 to UNn are used as the pull-up ODT resistor, the NMOS transistors UN1 to UNn may terminate the high-level data, which is applied through the data terminal DQP, with a first high voltage VOH1 which is equal to the output power supply voltage VDDQ or is lower than the output power supply voltage VDDQ by a predetermined voltage (e.g., a threshold voltage Vth of the NMOS transistor), and terminate the low-level data with a first low voltage VOL1 between the first high voltage VOH1 and the ground voltage VSS, as shown in FIG. 2.

In other words, the pull-up NMOS driver 16-1 may be used as a driver to output the data through the data terminal DQP while the read operation is performed, and may be used as a pull-up ODT resistor to terminate the data applied through the data terminal DQP while the write operation is performed.

The NMOS transistors DN1 to DNn may be turned on or off in response to the pull-down control signal rdc2. For example, when each bit of the n-bit pull-down control signal rdc2 is a high-level bit, each of the NMOS transistors DN1 to DNn may be turned on to generate low-level data through the data terminal DQP. In this case, when the number of turned-on NMOS transistors DN1 to DNn is large, the number of resistors connected in parallel may be increased, so that a resistance value of the pull-down NMOS driver 16-2 may be reduced.

Therefore, the driving ability of the pull-down NMOS driver 16-2 may be increased.

Figure 3:
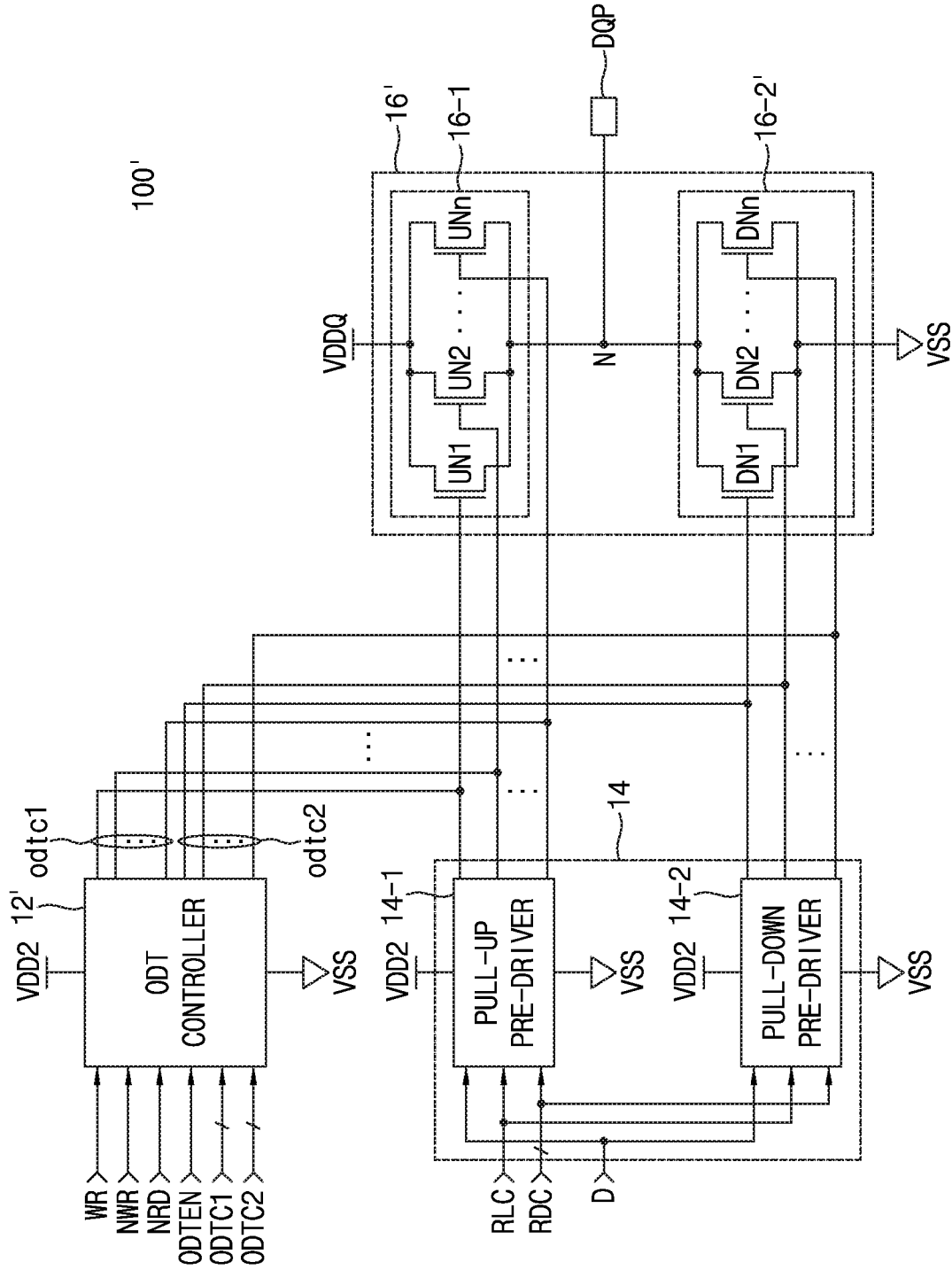
FIG. 3 is a diagram showing an output driver according to an exemplary embodiment of the inventive concept.
Figure 4:
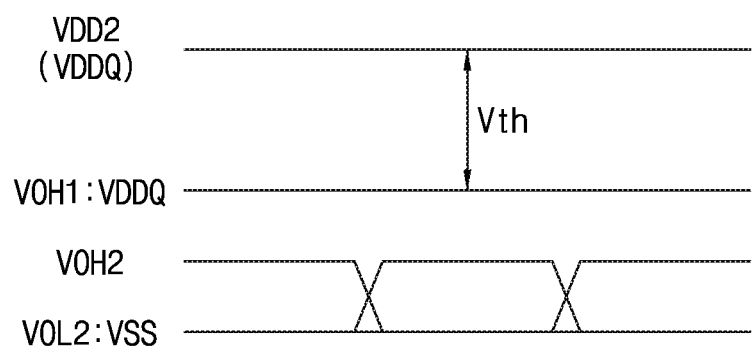
FIG. 4 shows a second high voltage and a second low voltage during a pull-down on-die termination operation according to an exemplary embodiment of the inventive concept.

FIG. 3 is a diagram showing an output driver according to an exemplary embodiment of the inventive concept, and FIG. 4 shows a second high voltage and a second low voltage during a pull-down on-die termination operation according to an exemplary embodiment of the inventive concept.

An output driver 100' may include an ODT controller 12' and a pull-down NMOS driver 16-2' (included in a main driver 16') in place of the ODT controller 12 and the pull-down NMOS driver 16-2 of the output driver 100 shown in FIG. 1.

Among the blocks shown in FIG. 3, blocks having the same reference numerals as the blocks shown in FIG. 1 may have substantially the same configurations and functions as the blocks shown in FIG. 1. Here, only the functions of the replaced blocks will be described.

The ODT controller 12' may receive the first ODT control code ODTC1 to generate the first ODT control signal odtc1 in response to the write command WR and the ODT enable signal ODTEN, and may receive a second ODT control code ODTC2 to generate the second ODT control signal odtc2 in response to a non-target write command NWR or a non-target read command NRD and the ODT enable signal ODTEN, while a write operation is performed. The non-target write command NWR or the non-target read command NRD may be generated when the write operation or a read operation is not performed and data is input. In other words, the ODT controller 12' may generate the first ODT control signal odtc1 while the data is input through the data terminal DQP when the write command is applied, and may generate the second ODT control signal odtc2 while the data is input through the data terminal DQP when the non-target write command NWR or the non-target read command NRD is applied. For example, each of the first ODT control signal odtc1 and the second ODT control signal odtc2 may be n-bit data.

The pull-down NMOS driver 16-2' may have substantially the same configuration and function as the pull-down NMOS driver 16-2 shown in FIG. 1. Additionally, NMOS transistors DN1 to DNn may be turned on or off in response to the second ODT control signal odtc2, so that a resistance value of the pull-down NMOS driver 16-2' may be determined and the NMOS transistors DN1 to DNn may be used as a pull-down ODT resistor. As the number of turned-on NMOS transistors DN1 to DNn is increased, the resistance value of the pull-down NMOS driver 16-2' may be reduced. When the NMOS transistors DN1 to DNn are used as the pull-down ODT resistor, the NMOS transistors DN1 to DNn may terminate low-level data with a second low voltage VOL2, which is the ground voltage VSS, when the low-level data is applied through the data terminal DQP, and terminate high-level data with a second high voltage VOH2 lower than the first high voltage VOH1 when the high-level data is applied, as shown in FIG. 4.

In other words, the pull-down NMOS driver 16-2' may be used as a driver to output the data through the data terminal DQP when the read command is applied, and may be used as a pull-down ODT resistor to terminate the data applied through the data terminal DQP when the non-target write command NWR or the non-target read command NRD is applied.

The main driver 16 or 16' according to the exemplary embodiments shown in FIG. 1 or 3 may be used as a driver while the read operation is performed. The pull-up NMOS driver 16-1 may be used as a pull-up ODT resistor when the data is input while the write operation is performed. The pull-down NMOS driver 16-2' may be used as a pull-down ODT resistor when the write operation or the read operation is not performed and the data is input.

The ODT controller 12' shown in FIG. 3 may receive the second ODT control code ODTC2 to generate the second ODT control signal odtc2 in response to the write command WR and the ODT enable signal ODTEN, and may receive the first ODT control code ODTC1 to generate the first ODT control signal odtc1 in response to the non-target write command NWR or the non-target read command NRD and the ODT enable signal ODTEN. In this case, the main driver 16' according to the exemplary embodiment shown in FIG. 3 may be used as a driver while the read operation is performed. The pull-down NMOS driver 16-2' may be used as a pull-down ODT resistor when the data is input while the write operation is performed. The pull-up NMOS driver 16-1 may be used as a pull-up ODT resistor when the write operation or the read operation is not performed and the data is input.

Figure 5:
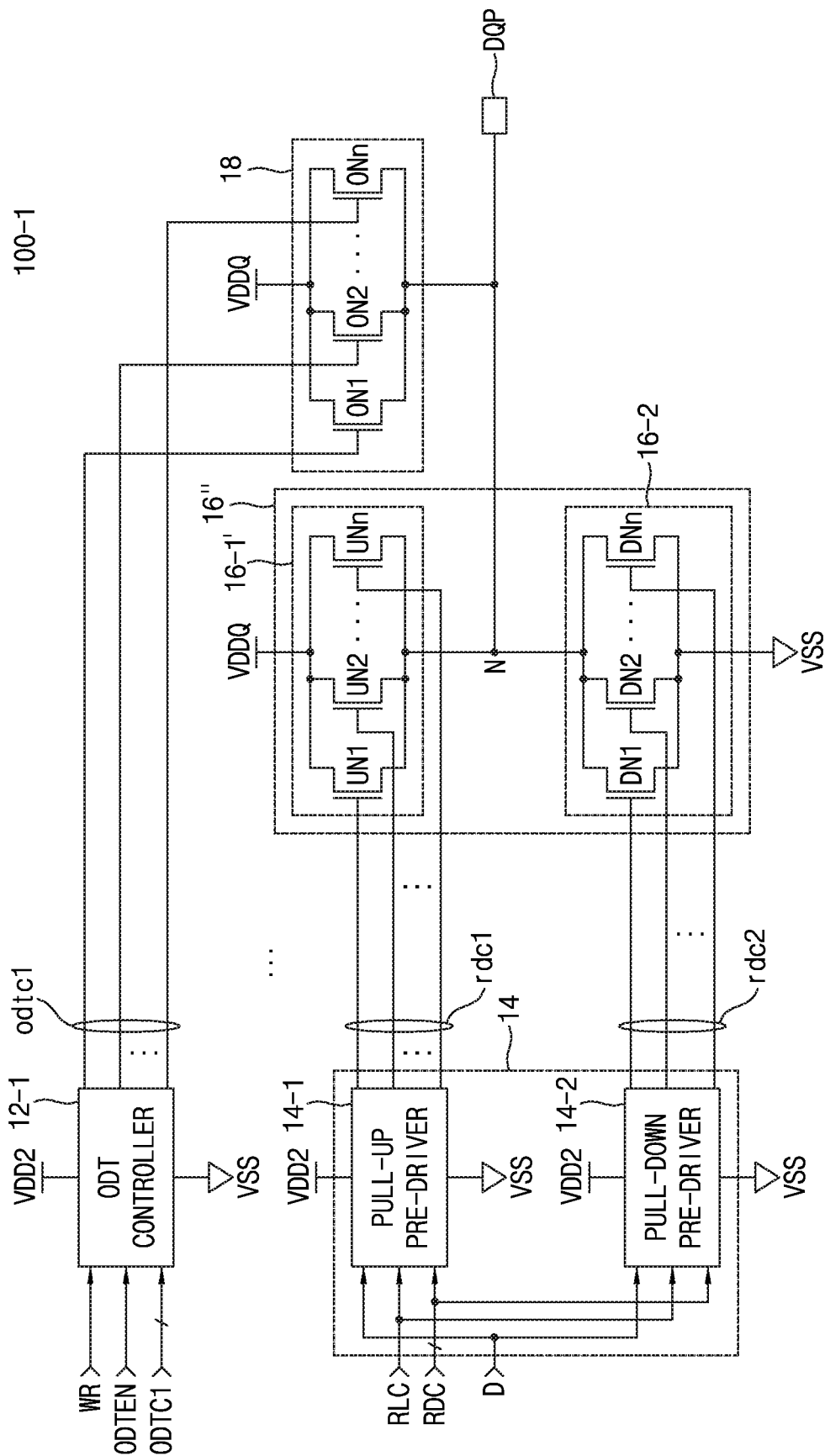
FIGS. 5 to 8 are diagrams showing output drivers according to exemplary embodiments of the inventive concept.

FIG. 5 is a diagram showing an output driver according to an exemplary embodiment of the inventive concept, and an output driver 100-1 may include an ODT controller 12-1 and a pull-up NMOS driver 16-1' (included in a main driver 16") in place of the ODT controller 12 and the pull-up NMOS driver 16-1 of the output driver 100 shown in FIG. 1, and may further include a pull-up ODT resistor 18. The pull-up ODT resistor 18 may include n NMOS transistors ON1 to ONn connected in parallel between the output power supply voltage VDDQ and the node N.

Among the blocks shown in FIG. 5, blocks having the same reference numerals as the blocks shown in FIG. 1 may have substantially the same configurations and functions as the blocks shown in FIG. 1. Here, only the functions of the replaced blocks will be described.

The ODT controller 12-1 may generate the first ODT control signal odtc1 by performing substantially the same function as the ODT controller 12 shown in FIG. 1.

The pull-up NMOS driver 16-1' may be used as a driver to output data through the data terminal DQP while a read operation is performed in substantially the same manner as the pull-up NMOS driver 16-1 shown in FIG. 1. On the other hand, the pull-up NMOS driver 16-1' may not be used as a pull-up ODT resistor.

A resistance value of the pull-up ODT resistor 18 may be determined in response to the first ODT control signal odtc1. Each of the NMOS transistors ON1 to ONn may be turned on or off in response to each bit of the n-bit first ODT control signal odtc1, so that the resistance value of the pull-up ODT resistor 18 may be determined and each of the NMOS transistors ON1 to ONn may be used as a pull-up ODT resistor. As the number of turned-on NMOS transistors ON1 to ONn is increased, the resistance value of the pull-up ODT resistor 18 may be reduced. When the NMOS transistors ON1 to ONn are used as the pull-up ODT resistor, the NMOS transistors ON1 to ONn may terminate high-level data, which is applied through the data terminal DQP, with the first high voltage VOH1 which is equal to the output power supply voltage VDDQ or is lower than the output power supply voltage VDDQ by a predetermined voltage (e.g., the threshold voltage Vth of the NMOS transistor), and terminate low-level data with the first low voltage VOL1 between the first high voltage VOH1 and the ground voltage VSS, as shown in FIG. 2.

Figure 6:
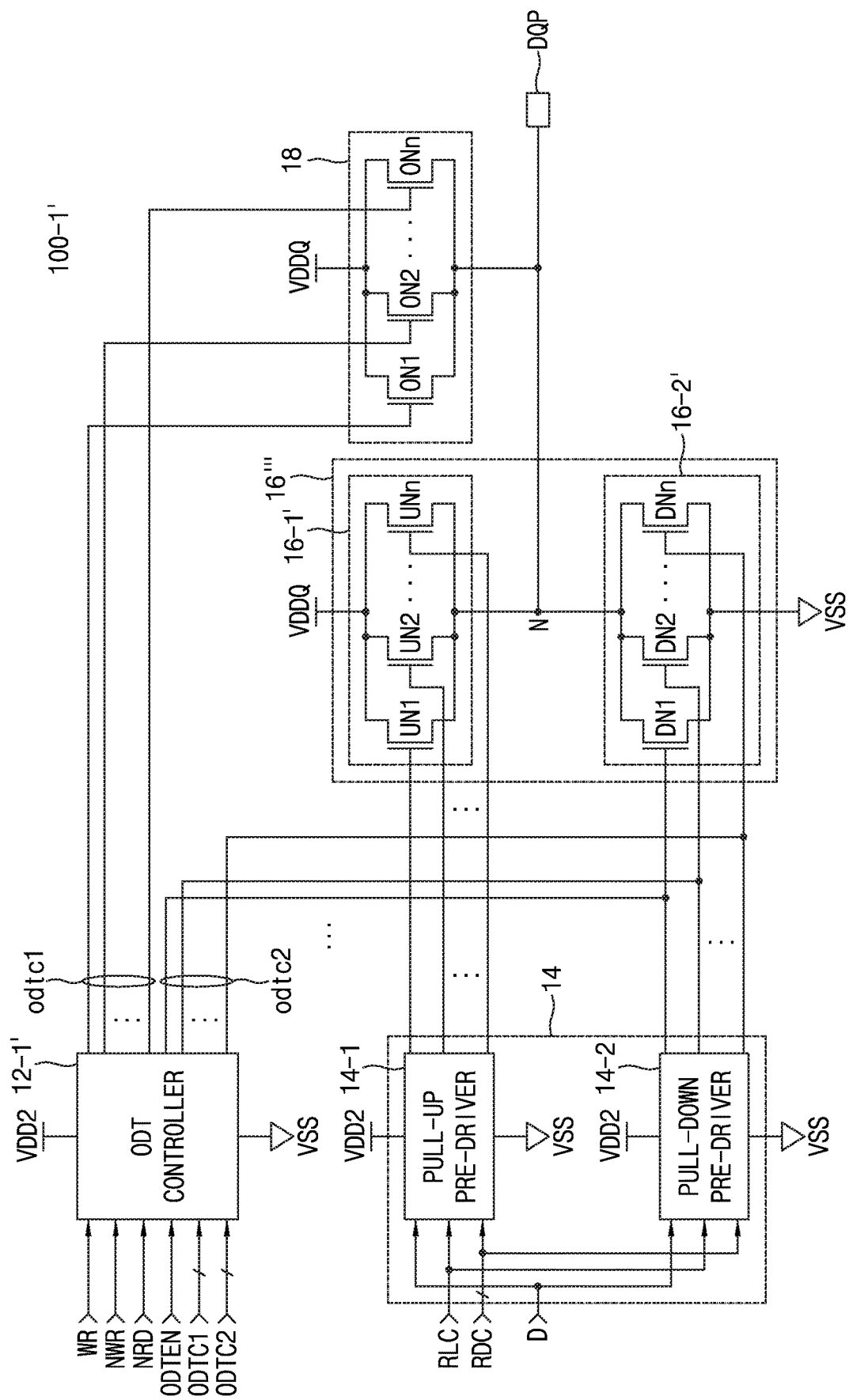

FIG. 6 is a diagram showing an output driver according to an exemplary embodiment of the inventive concept, and an output driver 100-1' may include an ODT controller 12-1' and a pull-down NMOS driver 16-2' (included in a main driver 16''') in place of the ODT controller 12-1 and the pull-down NMOS driver 16-2 of the output driver 100-1 shown in FIG. 5.

Among the blocks shown in FIG. 6, blocks having the same reference numerals as the blocks shown in FIG. 5 may have substantially the same configurations and functions as the blocks shown in FIG. 5. Here, only the functions of the replaced blocks will be described.

Referring to FIG. 6, the ODT controller 12-1' may have substantially the same configuration and functions as the ODT controller 12' shown in FIG. 3.

The pull-down NMOS driver 16-2' may have substantially the same configuration and functions as the pull-down NMOS driver 16-2' shown in FIG. 3.

The pull-up NMOS driver 16-1' shown in FIG. 6 may be used as a pull-up driver while a read operation is performed. The pull-up ODT resistor 18 may terminate data when data is input while a write operation is performed, as shown in FIG. 2. The pull-down NMOS driver 16-2' may be used as a pull-down driver while the read operation is performed, and may be used as a pull-down ODT resistor for terminating data when the write operation or the read operation is not performed and the data is input, as shown in FIG. 4.

The ODT controller 12-1' shown in FIG. 6 may receive the second ODT control code ODTC2 to generate the second ODT control signal odtc2 in response to the write command WR and the ODT enable signal ODTEN, and may receive the first ODT control code ODTC1 to generate the first ODT control signal odtc1 in response to the non-target write command NWR or the non-target read command NRD and the ODT enable signal ODTEN. In this case, the pull-down NMOS driver 16-2' according to the present exemplary embodiment shown in FIG. 6 may be used as a pull-down driver while the read operation is performed, and may be used as a pull-down ODT resistor when the data is input while the write operation is performed. The pull-up ODT resistor 18 may be used as a pull-up ODT resistor when the write operation or the read operation is not performed and the data is input.

Figure 7:
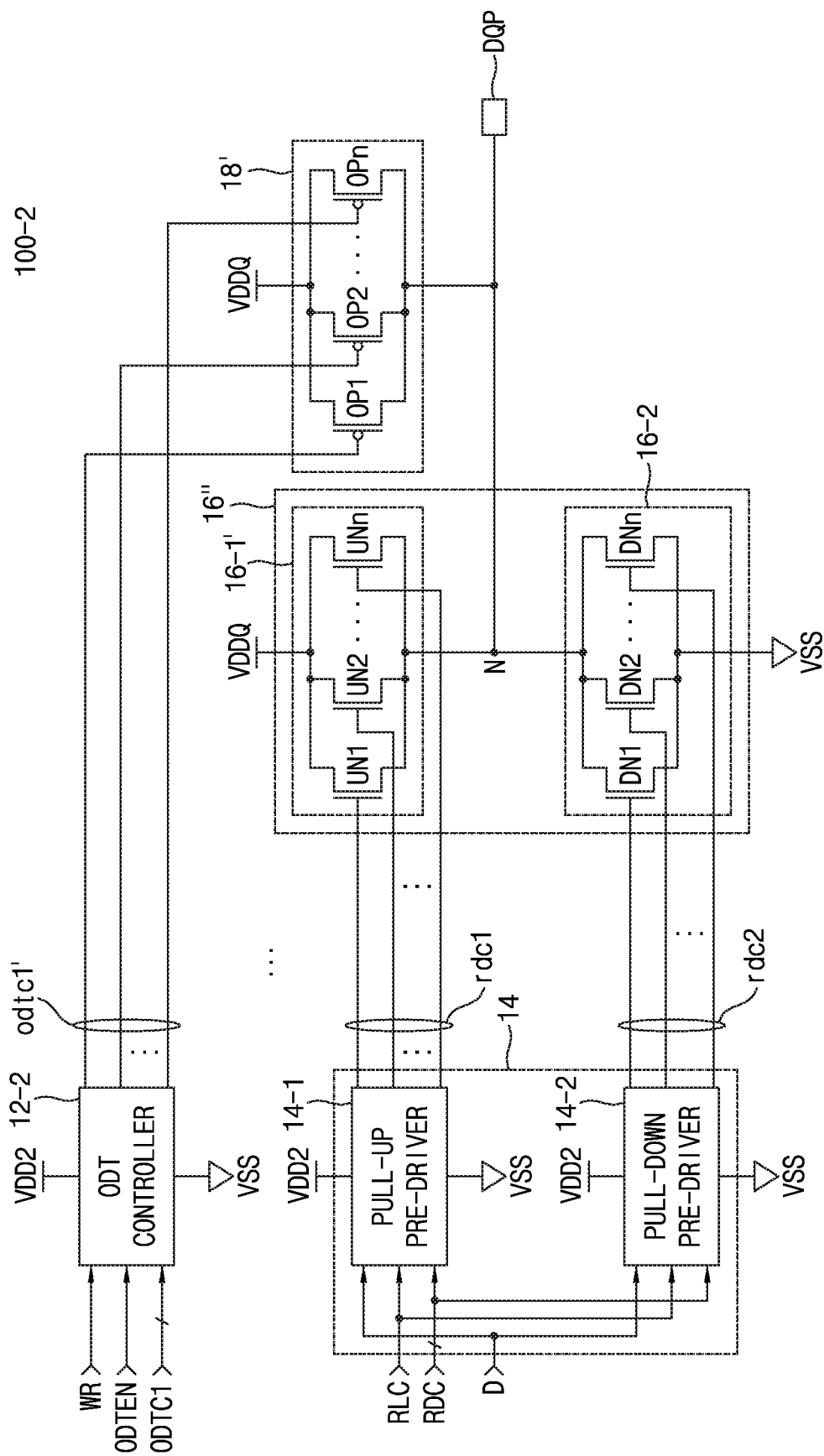

FIG. 7 is a diagram showing an output driver according to an exemplary embodiment of the inventive concept, and an output driver 100-2 may include an ODT controller 12-2 and a pull-up ODT resistor 18' in place of the ODT controller 12-1 and the pull-up ODT resistor 18 of the output driver 100-1 shown in FIG. 5. The pull-up ODT resistor 18' may include n p-channel metal-oxide-semiconductor (PMOS) transistors OP1 to OPn connected in parallel between the output power supply voltage VDDQ and the node N.

Among the blocks shown in FIG. 7, blocks having the same reference numerals as the blocks shown in FIG. 5 may have substantially the same configurations and functions as the blocks shown in FIG. 5. Here, only the functions of the replaced blocks will be described.

The ODT controller 12-2 may generate a first ODT control signal odtc1' by performing substantially the same function as the ODT controller 12-1 shown in FIG. 5. The first ODT control signal odtc1' may have a phase opposite that of the first ODT control signal odtc1 shown in FIG. 5.

A resistance value of the pull-up ODT resistor 18' may be determined in response to the first ODT control signal odtc1'. Each of the PMOS transistors OP1 to OPn may be turned on or off in response to each bit of the n-bit first ODT control signal odtc1' and used as a pull-up ODT resistor. As the number of turned-on PMOS transistors OP1 to OPn is increased, the resistance value of the pull-up ODT resistor 18' may be reduced. As shown in FIG. 2, the PMOS transistors OP1 to OPn may terminate high-level data, which is applied through the data terminal DQP, with the first high voltage VOH1 which is equal to the output power supply voltage VDDQ, and terminate low-level data with the first low voltage VOL1 between the first high voltage VOH1 and the ground voltage VSS.

Figure 8:
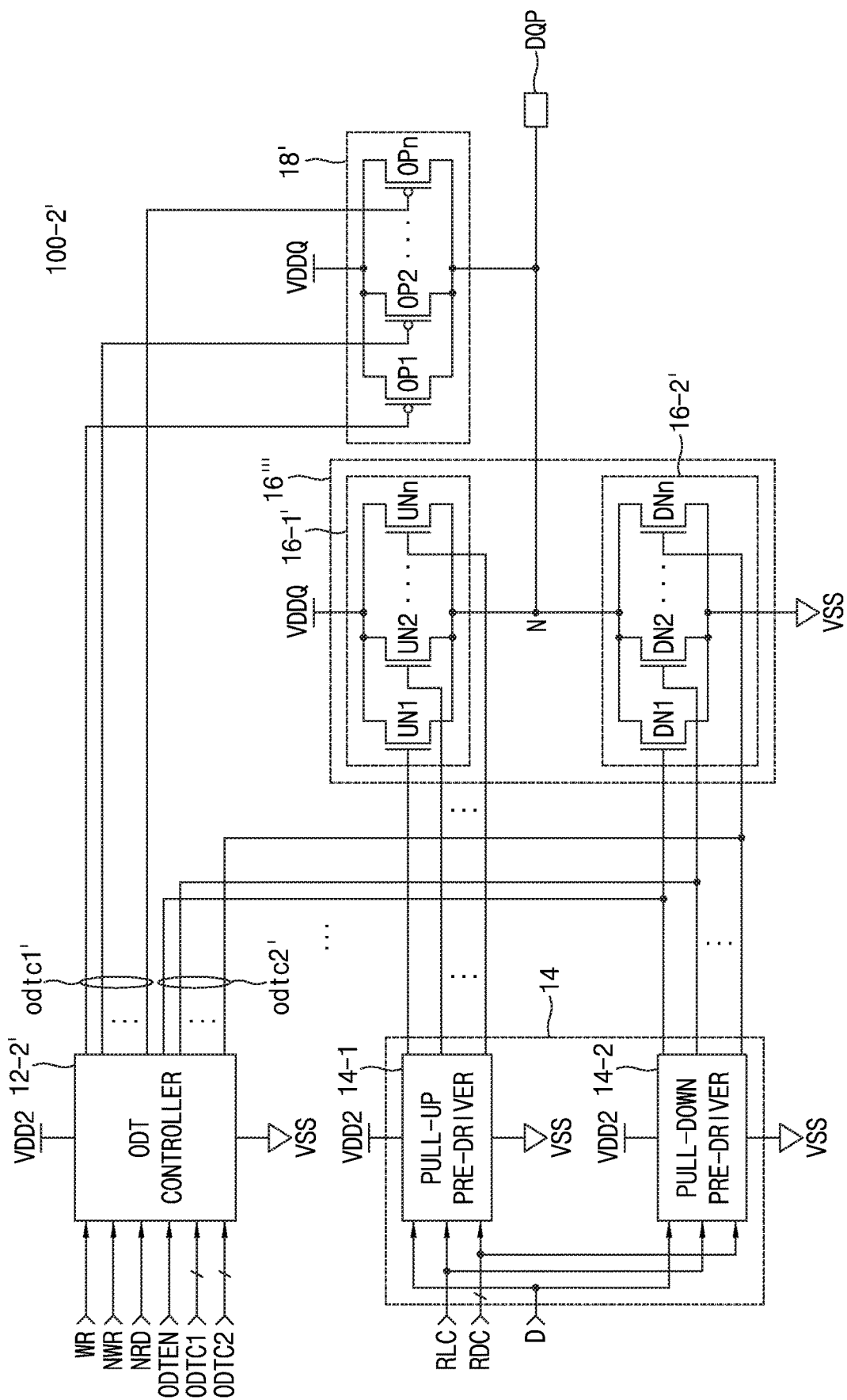

FIG. 8 is a diagram showing an output driver according to an exemplary embodiment of the inventive concept, and an output driver 100-2' may include an ODT controller 12-2' and a pull-down NMOS driver 16-2' (included in a main driver 16''') in place of the ODT controller 12-2 and the pull-down NMOS driver 16-2 of the output driver 100-2 shown in FIG. 7.

Among the blocks shown in FIG. 8, blocks having the same reference numerals as the blocks shown in FIG. 7 may have substantially the same configurations and functions as the blocks shown in FIG. 7. Here, only the functions of the replaced blocks will be described.

The ODT controller 12-2' may receive the first ODT control code ODTC1 to generate the first ODT control signal odtc1' in response to the write command WR and the ODT enable signal ODTEN, and may receive the second ODT control code ODTC2 to generate a second ODT control signal odtc2' in response to the non-target write command NWR or the non-target read command NRD and the ODT enable signal ODTEN. The first ODT control signal odtc1' may have a phase opposite that of the first ODT control signal odtc1 shown in FIG. 6. The non-target write command NWR or the non-target read command NRD may be generated when a write operation or a read operation is not performed and data is input. In other words, the ODT controller 12-2' may generate the first ODT control signal odtc1' when the data is input through the data terminal DQP when the write operation is performed, and may generate the second ODT control signal odtc2' when the write operation or the read operation is not performed and the data is input through the data terminal DQP. For example, each of the first ODT control signal odtc1 and the second ODT control signal odtc2' may be n-bit data.

The pull-down NMOS driver 16-2' may have substantially the same configuration and functions as the pull-down NMOS driver 16-2' shown in FIG. 6.

The pull-up NMOS driver 16-1' shown in FIG. 8 may be used as a pull-up driver while the read operation is performed. The pull-up ODT resistor 18' may terminate the data when the data is input while the write operation is performed, as shown in FIG. 2. The pull-down NMOS driver 16-2' may be used as a pull-down driver while the read operation is performed and used as a pull-down ODT resistor for terminating data when the write operation or the read operation is not performed and the data is input, as shown in FIG. 4.

The ODT controller 12-2' shown in FIG. 8 may receive the second ODT control code ODTC2 to generate the second ODT control signal odtc2' in response to the write command WR and the ODT enable signal ODTEN, and may receive the first ODT control code ODTC1 to generate the first ODT control signal odtc1' in response to the non-target write command NWR or the non-target read command NRD and the ODT enable signal ODTEN, while the write operation is performed. In this case, the pull-down NMOS driver 16-2' according to the present exemplary embodiment shown in FIG. 8 may be used as a pull-down driver while the read operation is performed and used as a pull-down ODT resistor when the data is input while the write operation is performed. The pull-up ODT resistor 18' may be used as a pull-up ODT resistor when the write operation or the read operation is not performed and the data is input.

As shown in FIG. 7 or 8, when the pull-up ODT resistor 18' includes the PMOS transistors OP1 to OPn, the output power supply voltage VDDQ may be lower than internal power supply voltage VDD2.

For example, referring to FIG. 1 or 5, and 2, when the output power supply voltage VDDQ is 1 V, the internal power supply voltage VDD2 is 1 V, the ground voltage VSS is 0 V, and the threshold voltage Vth of the NMOS transistor is 0.5 V, the first high voltage VOH1 may be 0.5 V, e.g., the output power supply voltage VDDQ—the threshold voltage Vth, and the first low voltage VOL1 may be 0.25 V. As another example, referring to FIG. 1, 5, or 7, and 2, even when the output power supply voltage VDDQ is 0.5 V, the internal power supply voltage VDD2 is 1 V, the ground voltage VSS is 0 V, the threshold voltage Vth of the NMOS transistor is 0.5 V, and the threshold voltage Vth of the PMOS transistor is −0.5 V, the first high voltage VOH1 may be 0.5 V as the output power supply voltage VDDQ, and the first low voltage VOL1 may be 0.25 V. When it is assumed that each of a reception device (e.g., a semiconductor memory device) and a transmission device (e.g., a controller) includes the output driver shown in FIG. 1, 5, or 7, the first high voltage VOH1 and the first low voltage VOL1 may be obtained based on the resistance value according to the first ODT control signal odtc1 or odtc1' of the pull-up NMOS driver or the pull-up ODT resistor of the reception device, the resistance value according to the pull-up control signal rdc1 of the pull-up NMOS driver of the transmission device, and the resistance value according to the pull-down control signal rdc2 of the pull-down NMOS driver.

Further, for example, referring to FIG. 1 or 6, and 4, when the output power supply voltage VDDQ is 1 V, the internal power supply voltage VDD2 is 1 V, the ground voltage VSS is 0 V, and the threshold voltage Vth of the NMOS transistor is 0.5 V, the second high voltage VOH2 may be 0.25 V, and the second low voltage VOL2 may be 0 V as the ground voltage VSS. As another example, referring to FIG. 1, 5, or 7, and 4, even when the output power supply voltage VDDQ is 0.5 V, the internal power supply voltage VDD2 is 1 V, the ground voltage VSS is 0 V, the threshold voltage Vth of the NMOS transistor is 0.5 V, and the threshold voltage Vth of the PMOS transistor is −0.5 V, the second high voltage VOH2 may be 0.25 V, and the second low voltage VOL2 may be 0 V. When it is assumed that each of the reception device and the transmission device includes the output driver shown in FIG. 1, the second high voltage VOH2 and the second low voltage VOL2 may be obtained based on the resistance value according to the second ODT control signal odtc2 of the pull-down NMOS driver of the reception device, the resistance value according to the pull-up control signal rdc1 of the pull-up NMOS driver of the transmission device, and the resistance value according to the pull-down control signal rdc2 of the pull-down NMOS driver.

The output driver according to an exemplary embodiment of the inventive concept may further include a pull-down ODT resistor connected between the node N and the ground voltage VSS. In this case, the pull-down ODT resistor may include n NMOS transistors connected in parallel between the node N and the ground voltage VSS. The n NMOS transistors may be turned on or off in response to the second ODT control signal odtc2 and may terminate the data, as shown in FIG. 4. In this case, the pull-down NMOS driver 16-2 or 16-2' may be used only as a driver and may not be used as a pull-down ODT resistor.

Figure 9:
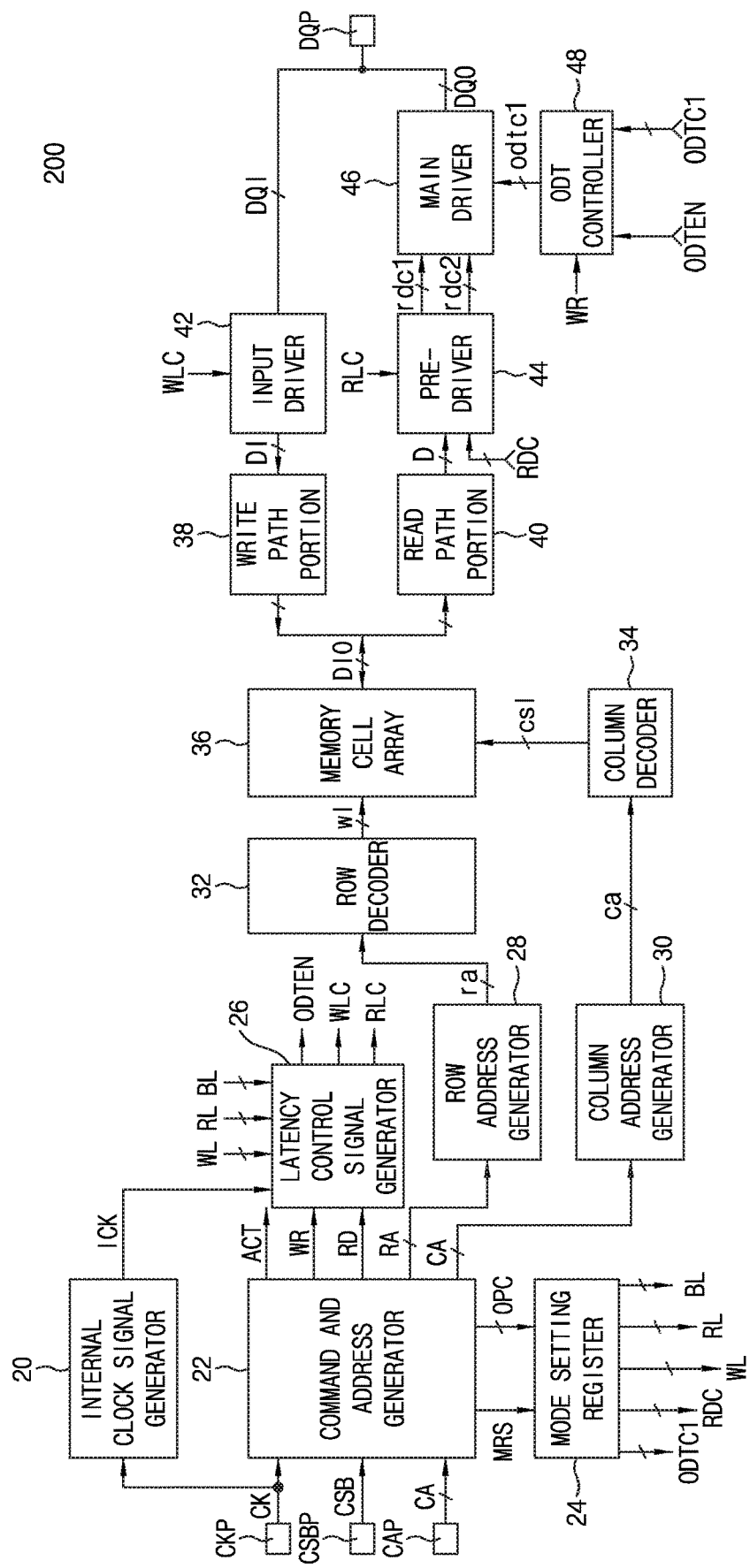
FIGS. 9 and 10 are block diagrams showing semiconductor memory devices according to exemplary embodiments of the inventive concept.

FIG. 9 is a block diagram showing a semiconductor memory device according to an exemplary embodiment of the inventive concept, and a semiconductor memory device 200 may include an internal clock signal generator 20, a command and address generator 22, a mode setting register 24, a latency control signal generator 26, a row address generator 28, a column address generator 30, a row decoder 32, a column decoder 34, a memory cell array 36, a write path portion 38, a read path portion 40, an input driver 42, a pre-driver 44, a main driver 46, and an ODT controller 48. Additionally, the semiconductor memory device 200 may include a clock signal terminal CKP to which a clock signal CK is applied, an inverted chip selection signal terminal CSBP to which an inverted chip selection signal CSB is applied, a command and address terminal CAP to which a command and address CA is applied, and the data terminal DQP through which data DQI or DQO is input or output.

Functions of the blocks shown in FIG. 9 will be described hereinafter.

The internal clock signal generator 20 may receive the clock signal CK to generate an internal clock signal ICK synchronized with the clock signal CK.

The command and address generator 22 may receive the inverted chip selection signal CSB and the command and address CA to decode the inverted chip selection signal CSB and command signals included in the command and address CA and generate internal commands in response to the clock signal CK, and may generate address signals included in the command and address CA as a row address RA, a column address CA, and a mode setting code OPC in response to the internal commands. The internal command may be an active command ACT, a write command WR, a read command RD, or a mode setting command MRS. The command and address generator 22 may generate the row address RA in response to the active command ACT, may generate the column address CA in response to the write command WR or the read command RD, and may generate the mode setting code OPC in response to the mode setting command MRS.

The mode setting register 24 may input the mode setting code OPC to set the first ODT control code ODTC1, the driver control code RDC, a write latency WL, a read latency RL, and a burst length BL in response to the mode setting command MRS.

The latency control signal generator 26 may generate a write control signal WLC and the ODT enable signal ODTEN in response to the write command WR and generate a read control signal RLC in response to the read command RD. When the write command WR is generated, the latency control signal generator 26 may generate the write control signal WLC and the ODT enable signal ODTEN, which are activated using a value of the write latency WL, and inactivated using the value of the write latency WL and a value of the burst length BL. Further, when the read command RD is generated, the latency control signal generator 26 may generate a read control signal RLC, which is activated using a value of the read latency RL, and inactivated using the value of the read latency RL and the value of the burst length BL.

The row address generator 28 may generate the row address RA as a row address signal ra.

The column address generator 30 may generate the column address CA as a column address signal ca.

The row decoder 32 may decode the row address signal ra to generate word line selection signals w1.

The column decoder 34 may decode the column address signal ca to generate column selection signals cs1.

The memory cell array 36 may receive or output data DIO from or to a plurality of memory cells selected in response to the word line selection signals w1 and the column selection signals cs1.

The write path portion 38 may receive data DI to generate the data DIO. The write path portion 38 may sequentially receive the number of data DI corresponding to the value of the burst length BL to generate the data DIO in parallel.

The read path portion 40 may receive the data DIO to generate data D. The read path portion 40 may receive the data DIO which is input in parallel to sequentially generate the number of data D corresponding to the value of the burst length BL.

The input driver 42 may be enabled in response to the write control signal WLC, and may receive input data DQI to generate the data DI.

The pre-driver 44 (e.g., the pre-driver 14 of FIGS. 1, 3, and 5 to 8) may be enabled in response to the read control signal RLC, and may generate some bits of the driver control code RDC as the pull-up control signal rdc1 (see FIGS. 1, 3, and 5 to 8) in response to the high-level data D and generate the remaining bits of the driver control code RDC as the pull-down control signal rdc2 (see FIGS. 1, 3, and 5 to 8) in response to the low-level data D.

The main driver 46 may adjust the driving ability of the pull-up NMOS driver 16-1 (see FIG. 1) to generate high-level output data DQO in response to the pull-up control signal rdc1, and may adjust the driving ability of the pull-down NMOS driver 16-2 (see FIG. 1) to generate low-level output data DQO in response to the pull-down control signal rdc2.

The ODT controller 48 may generate the first ODT control code ODTC1 as the first ODT control signal odtc1 (see FIG. 1) in response to the ODT enable signal ODTEN.

The semiconductor memory device 200 of FIG. 9 may further include the pull-up ODT resistor 18 or 18' (see FIG. 5, 6, 7, or 8).

The main driver 46 of the semiconductor memory device 200 shown in FIG. 9 may generate the output data DQO while the read operation is performed, and terminate the data applied through the data terminal DQP while the write operation is performed, as shown in FIG. 2. In other words, the main driver 46 shown in FIG. 9 may generate the input data DQI having a voltage obtained by subtracting a predetermined voltage from the output power supply voltage VDDQ, the first high voltage VOH1, which is equal to the output power supply voltage VDDQ, or the first low voltage VOL1 (e.g., a voltage between the first high voltage VOH1 and the ground voltage VSS), which is higher than the ground voltage VSS, while the write operation is performed. Accordingly, power consumption may be reduced more than when the input data DQI is terminated with the power supply voltage, and a level of the input data DQI may be higher than when the input data DQI is terminated with the ground voltage, and thus a circuit configuration of the input driver 42 may be simplified. In other words, a swing level of the input data DQI may be raised, and thus it may be easy to process the input data DQI using the NMOS transistor as well as the PMOS transistor in the circuit configuration of the input driver 42.

Figure 10:
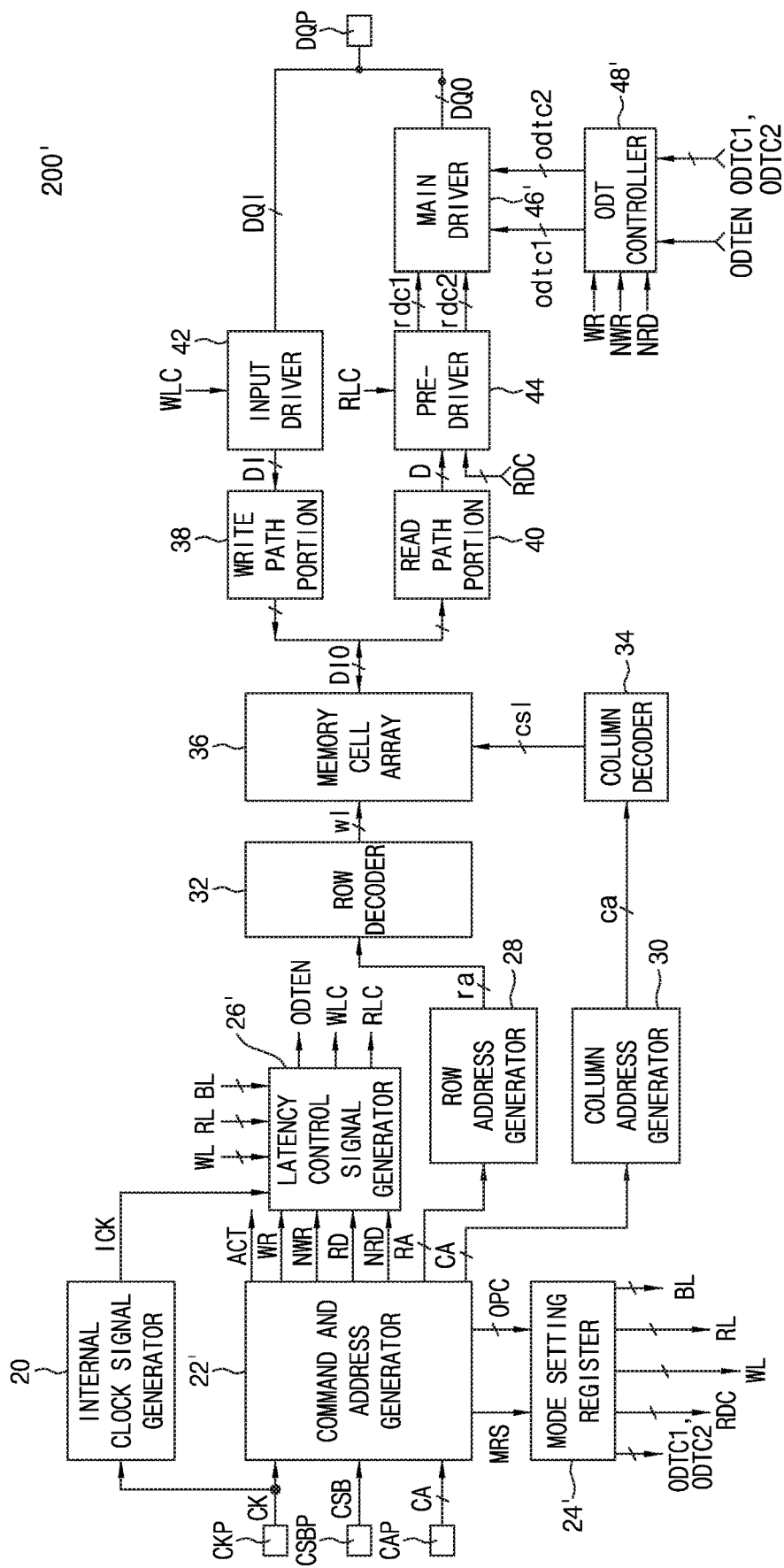

FIG. 10 is a block diagram showing a semiconductor memory device according to an exemplary embodiment of the inventive concept, and a semiconductor memory device 200' may include a command and address generator 22', a mode setting register 24', a latency control signal generator 26', a main driver 46', and an ODT controller 48' in place of the command and address generator 22, the mode setting register 24, the latency control signal generator 26, the main driver 46, and the ODT controller 48 shown in FIG. 9.

Functions of the blocks shown in FIG. 10 will be described hereinafter.

The command and address generator 22' may perform substantially the same function as the command and address generator 22 shown in FIG. 9. Additionally, the command and address generator 22' may receive the inverted chip selection signal CSB and the command and address CA to decode command signals included in the inverted chip selection signal CSB and the command and address CA, and additionally generate a non-target write command NWR and a non-target read command NRD in response to the clock signal CK.

The mode setting register 24' may receive the mode setting code OPC to set the first ODT control code ODTC1, the second ODT control code ODTC2, the write latency WL, the read latency RL, and the burst length BL in response to the mode setting command MRS.

The latency control signal generator 26' may perform substantially the same function as the latency control signal generator 26 shown in FIG. 9. Additionally, when the non-target write command NWR is generated, the latency control signal generator 26' may generate the ODT enable signal ODTEN, which is activated using a value of the write latency WL and inactivated using a value of the write latency WL and a value of the burst length BL. Further, when the non-target read command NRD is generated, the latency control signal generator 26' may generate the ODT enable signal ODTEN, which is activated using a value of the read latency RL and inactivated using the value of the read latency RL and the value of the burst length BL.

The main driver 46' may perform substantially the same function as the main driver 46 shown in FIG. 9. Additionally, the main driver 46' may adjust the driving ability of the pull-up NMOS driver (e.g., the pull-up NMOS driver 16-1 of FIG. 3) to generate high-level output data DQO in response to the pull-up control signal rdc1, and may adjust the driving ability of the pull-down NMOS driver (e.g., the pull-down NMOS driver 16-2' of FIG. 3) to generate low-level output data DQO in response to the pull-down control signal rdc2.

The ODT controller 48' may perform substantially the same operation as the ODT controller 12', 12-1', or 12-2' shown in FIG. 3, 6, or 8. In other words, the ODT controller 48' may generate the first ODT control code ODTC1 as the first ODT control signal odtc1 (see FIG. 3) and generate the second ODT control code ODTC2 as the second ODT control signal odtc2 (see FIG. 3) in response to the ODT enable signal ODTEN.

The semiconductor memory device 200' of FIG. 10 may further include the pull-up ODT resistor 18 or 18' (see FIG. 5, 6, 7, or 8).

When the non-target write command NWR or the non-target read command NRD is applied, the main driver 46' of the semiconductor memory device 200' shown in FIG. 10 may terminate the data with the second high voltage VOH2 lower than the first high voltage VOH1, or the second low voltage VOL2, which is the ground voltage lower than the first low voltage VOL1, as shown in FIG. 4, when the write operation or the read operation is not performed and the data is input through the data terminal DQP. Therefore, the data may be terminated while reducing power consumption.

Figure 11:
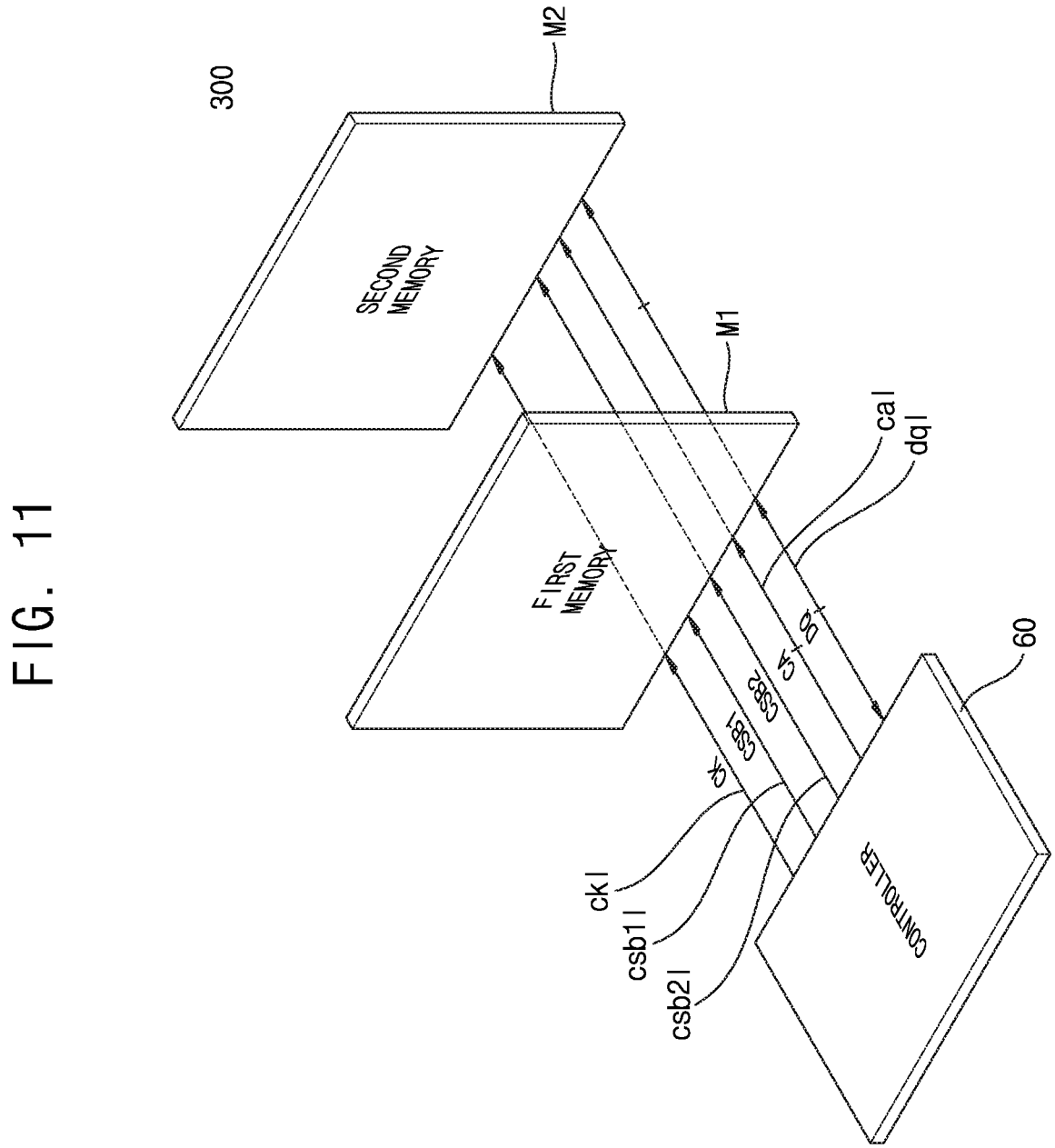
FIG. 11 is a block diagram showing a memory system according to an exemplary embodiment of the inventive concept.

FIG. 11 is a block diagram showing a memory system according to an exemplary embodiment of the inventive concept, and a memory system 300 may include a controller 60, a first memory M1, and a second memory M2. Each of the first memory M1 and the second memory M2 may be a semiconductor memory device, or a memory module including a plurality of semiconductor memory devices. Each of the controller 60, the first memory M1, and the second memory M2 may include the output driver shown in FIG. 1, 3, 5, 6, 7, or 8. Further, each of the first memory M1 and the second memory M2 may include the semiconductor memory device shown in FIG. 9 or 10.

Functions of the blocks shown in FIG. 11 will be described hereinafter.

The controller 60 may transmit the clock signal CK, a first inverted chip selection signal CSB1, a second inverted chip selection signal CSB2, and the command and address CA through a clock signal line ck1, a first inverted chip selection signal line csb11, a second inverted chip selection signal line csb21, and a command and address line ca1, and may receive or output data DQ through a data line dq1.

The first memory M1 may receive the clock signal CK, the first inverted chip selection signal CSB1, and the command and address CA, and may receive or output the data DQ.

The second memory M2 may receive the clock signal CK, the second inverted chip selection signal CSB2, and the command and address CA, and may receive or output the data DQ.

FIG. 12 is shows a command truth table of a command and address which is applied from a controller to a first memory and a second memory in FIG. 11 according to an exemplary embodiment of the inventive concept.

Referring to FIGS. 11 and 12, to apply an activate command ACTIVATE, the controller 60 may apply "low" levels to signals CA1 and CA2 of the command and address CA with a low-level inverted chip selection signal CSB at a first rising edge of the clock signal CK. To apply a write command WRITE and a non-target write command NT_WRITE, the controller 60 may apply a "high" level, a "low" level, a "high" level, a "high" level, and a "low" level as signals CA1 to CA5 of the command and address CA with the low-level inverted chip selection signal CSB at the first rising edge of the clock signal CK, to apply the write command WRITE, the controller 60 may apply a high-level inverted chip selection signal CSB at a second rising edge of the clock signal CK, and to apply the non-target write command NT_WRITE, the controller 60 may apply the low-level inverted chip selection signal CSB at the second rising edge of the clock signal CK. To apply a read command READ and a non-target read command NT_READ, the controller 60 may apply a "high" level, a "low" level, a "high" level, a "high" level, and a "high" level to the signals CA1 to CA5 of the command and address CA with the low-level inverted chip selection signal CSB at the first rising edge of the clock signal CK, to apply the read command READ, the controller 60 may apply the high-level inverted chip selection signal CSB at the second rising edge of the clock signal CK, and to apply the non-target read command NT_READ, the controller 60 may apply the low-level inverted chip selection signal CSB at the second rising edge of the clock signal CK. To apply a mode setting command MODE REGISTER SET, the controller 60 may apply a "high" level, a "low" level, a "high" level, a "low" level, and a "low" level to the signals CA1 to CA5 of the command and address CA with the low-level inverted chip selection signal CSB at the first rising edge of the clock signal CK, and apply the high-level inverted chip selection signal CSB at the second rising edge of the clock signal CK.

In FIG. 12, signals indicated as "I" may refer to row addresses, signals indicated as "II" may refer to column addresses, signals indicated as "III" may refer to mode setting codes, and signals indicated as "X" may refer to don't care states.

Figure 13:
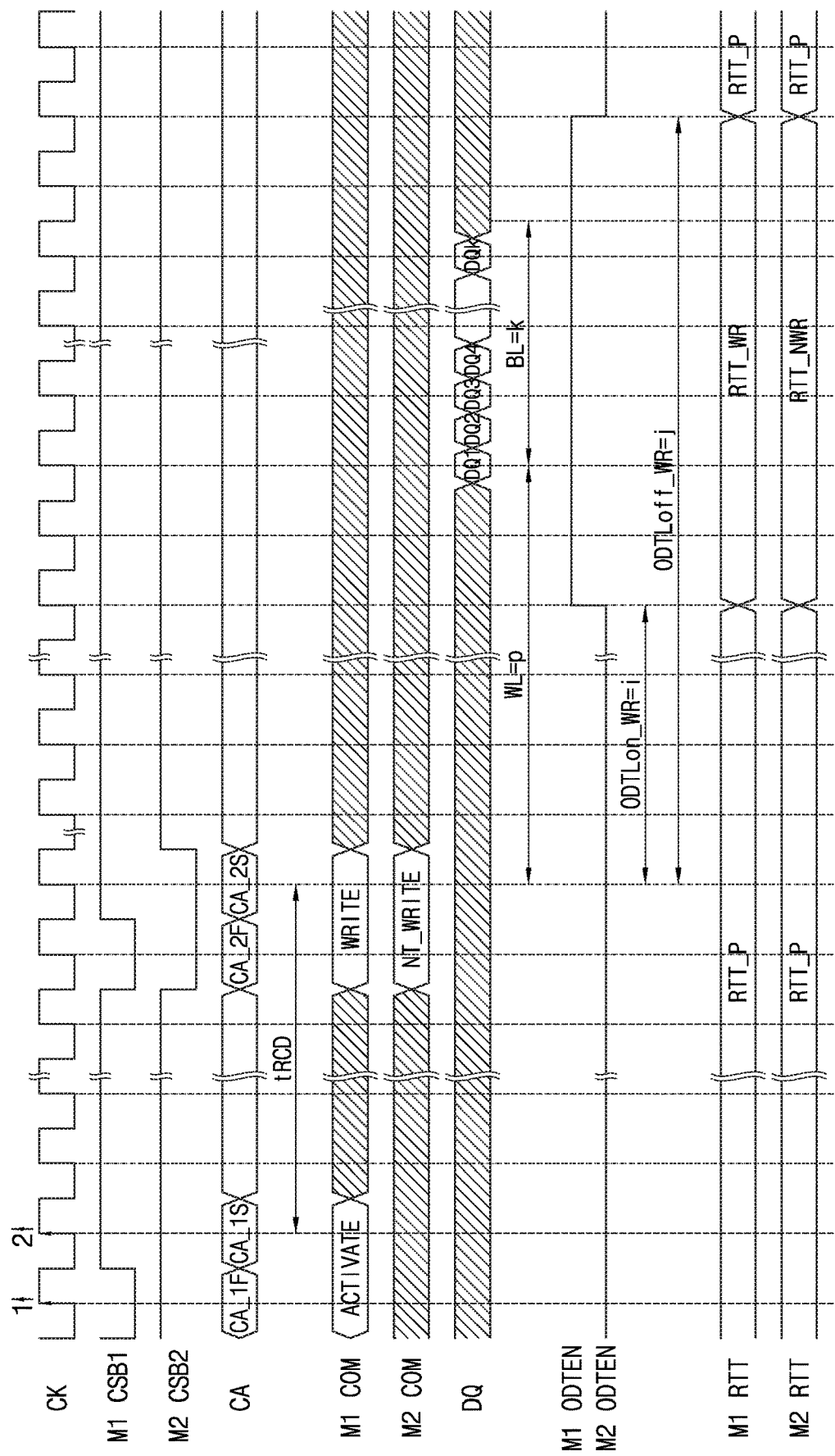
FIGS. 13 and 14 are operational timing diagrams for describing operations of a memory system according to an exemplary embodiment of the inventive concept.
Figure 14:
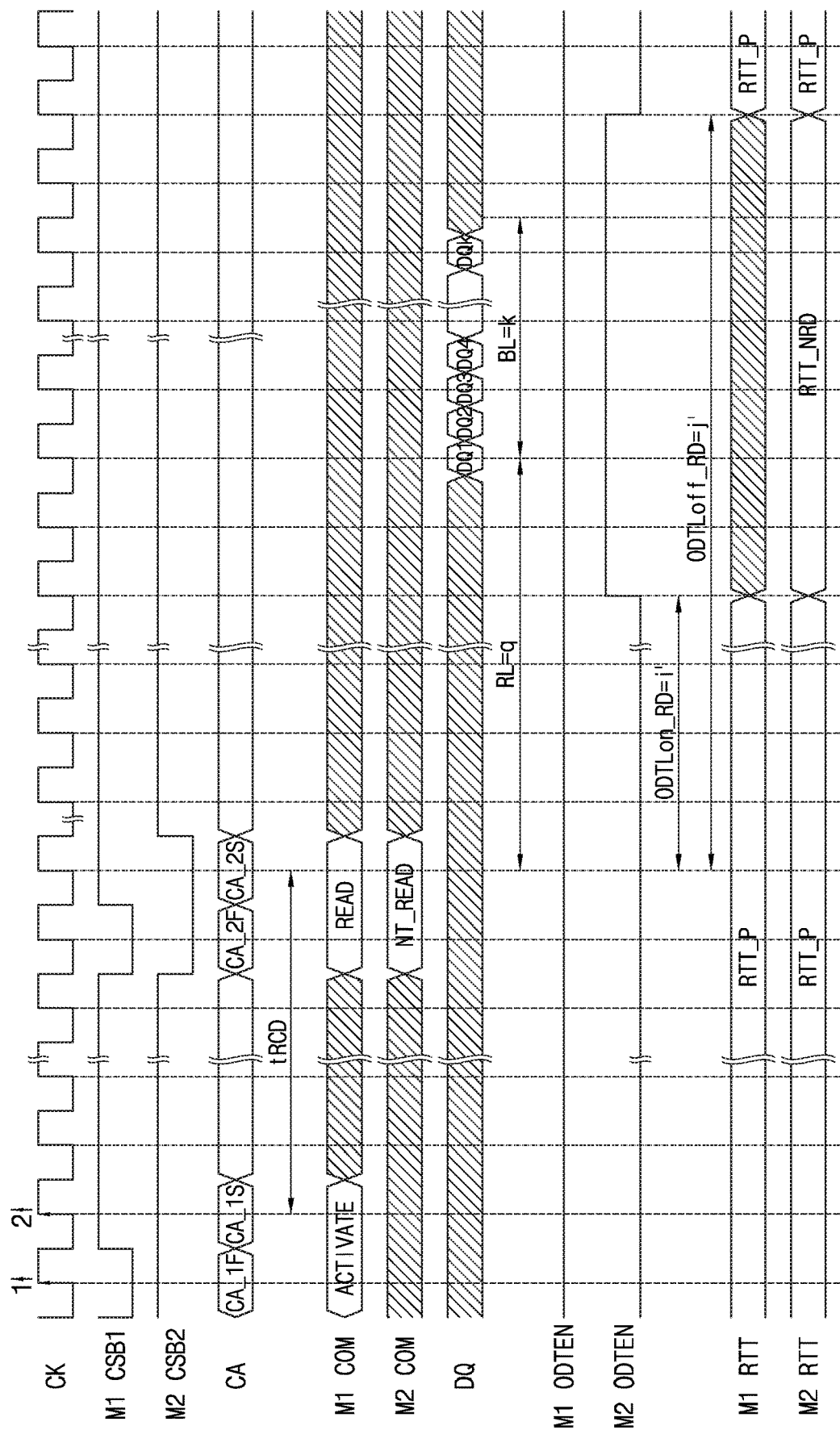

FIGS. 13 and 14 are operational timing diagrams for describing operations of a memory system according to an exemplary embodiment of the inventive concept, which show the clock signal CK, the first and second inverted chip selection signals CSB1 and CSB2, the command and address CA, the data DQ, the ODT enable signal ODTEN, and a resistance value RTT of the ODT resistor of each of the first and second memories M1 and M2, which are shown in FIG. 9 or 10, when the first memory M1 of the memory system 600 shown in FIG. 11 is a target memory which performs a read operation or a write operation and the second memory M2 is a non-target memory which does not perform the read operation or the write operation. Further, FIGS. 13 and 14 are operational timing diagrams showing the case in which the values of the write latency WL, the read latency RL, and the burst length BL of each of the first memory M1 and the second memory M2 are set to p, q, and k, respectively, and an ODT on write latency ODTLon_WR, an ODT off write latency ODTLoff_WR, an ODT on read latency ODTLon_RD, and an ODT off read latency ODTLoff_RD are set to i, j, i', and j', respectively.

FIG. 13 is a diagram for describing an operation of the case in which data is written from the controller 60 to the first memory M1. The controller 60 may apply the activate command ACTIVATE to the first memory M1, and may apply the write command WRITE to the first memory M1 and apply the non-target write command NT_WRITE to the second memory M2 after a first predetermined time tRCD. Further, after the controller 60 applies a command and address CA_2S, the controller 60 may sequentially output the number of data DQ1 to DQk corresponding to k, which is a value of the burst length BL, after a clock cycle corresponding to p, which is a value of the write latency WL.

When the write command WRITE or the non-target write command NT_WRITE is applied to the first memory M1 and the second memory M2, the ODT enable signal ODTEN may be generated, in the first memory M1 and the second memory M2. The ODT enable signal ODTEN may be activated after a clock cycle i corresponding to an ODT on write latency ODTLon_WR, which is a value obtained by subtracting 2 from the value of the write latency WL. The ODT enable signal ODTEN may be inactivated after a clock cycle j corresponding to an ODT off write latency ODTLoff_WR, which is a value obtained by adding the value of the write latency WL to the value of the burst length BL (BL/2 when the first memory M1 and the second memory M2 are double date rate (DDR) dynamic semiconductor memory devices (DRAMs)) and 2. In the first memory M1, the resistance value of the pull-up NMOS driver 16-1 (see FIG. 1 or 3) of the main driver 16 or the pull-up ODT resistor 18 or 18' (see FIG. 5, 6, 7, or 8) may be changed from a first value RTT_P, which is a default value, to a second value RTT_WR in response to the ODT enable signal ODTEN and the first ODT control signal odtc1 or odtc1' (see FIG. 1, 3, 5, 6, 7 or 8).

In the second memory M2, the resistance value of the pull-down NMOS driver 16-2' (see FIG. 3, 6, or 8) may be changed from the first value RTT_P to a third value RTT_NWR in response to the ODT enable signal ODTEN and the second ODT control signal odtc2 (see FIG. 3, 6, or 8).

FIG. 14 is a diagram for describing an operation of the case in which data is read from the controller 60 to the first memory M1. The controller 60 may apply the activate command ACTIVATE to the first memory M1, and may apply the read command READ to the first memory M1 and apply the non-target read command NT_READ to the second memory M2 after the first predetermined time tRCD. When the read command READ is applied to the first memory M1, the main driver 46 or 46' (see FIG. 9 or 10) may sequentially output the number of data DQ1 to DQk corresponding to k, which is a value of the burst length BL, after a clock cycle corresponding to q, which is a value of the read latency RL.

When the non-target read command NT_READ is applied to the second memory M2, the ODT enable signal ODTEN may be generated, in the second memory M2. The ODT enable signal ODTEN may be activated after a clock cycle i' corresponding to the ODT on read latency ODTLon_RD, which is a value obtained by subtracting 2 from the value of the read latency RL.

The ODT enable signal ODTEN may be inactivated after a clock cycle j' corresponding to the ODT off read latency ODTLoff_RD, which is a value obtained by adding the value of the read latency RL to the value of the burst length BL (BL/2 when the first memory M1 and the second memory M2 are DDR dynamic semiconductor memory devices (DRAMs)) and 2.

In the second memory M2, the resistance value of the pull-down NMOS driver 16-2' (see FIG. 3, 6, or 8) may be changed from the first value RTT_P to a fourth value RTT_NRD in response to the ODT enable signal ODTEN and the second ODT control signal odtc2 (see FIG. 3, 6, or 8).

As described above, according to the exemplary embodiments of the inventive concept, power consumption can be reduced more than when input data is terminated with an output power supply voltage and a level of the input data can be higher than when the input data is terminated with a ground voltage, and thus a circuit configuration of an input driver can be simplified.

According to exemplary embodiments of the inventive concept, the input data can be terminated with the ground voltage when a write operation or a read operation is not performed and data is input. Accordingly, the input data can be terminated while reducing power consumption.

While the exemplary embodiments of the inventive concept have been shown and described with reference to the accompanying drawings, it should be understood by those of ordinary skill in the art that various modifications in form and details may be made thereto without departing from the spirit and scope of the inventive concept as set forth by the following claims.

What is claimed is:

1. An output driver comprising:
a pre-driver configured to receive a driver control code to generate a pull-up control signal or a pull-down control signal in response to data while a read operation is performed;
an on-die termination controller configured to receive a first on-die termination control code to generate a first on-die termination control signal in response to an on-die termination enable signal while a write operation is performed; and
a main driver comprising a pull-up n-channel metal-oxide-semiconductor (NMOS) driver and a pull-down NMOS driver,
wherein the pull-up NMOS driver is configured to generate high-level output data in response to the pull-up control signal while the read operation is performed,
wherein the pull-up NMOS driver is further configured to terminate high-level input data with a first high voltage which is lower than or equal to an output power supply voltage and is lower than an internal power supply voltage, and terminate low-level input data with a first low voltage between the first high voltage and a ground voltage, in response to the first on-die termination control signal while the write operation is performed,
wherein the pull-down NMOS driver is configured to generate low-level output data in response to the pull-down control signal while the read operation is performed,
wherein the output power supply voltage applied to the pull-up NMOS driver is lower than or equal to the internal power supply voltage applied to the pre-driver and the on-die termination controller, and
wherein a high-level of each of the pull-up control signal, the pull-down control signal, and the first on-die termination control signal is the internal power supply voltage.

2. The output driver of claim 1, wherein:
the pull-up NMOS driver comprises a predetermined number of first NMOS transistors connected in parallel between the output power supply voltage and a data terminal, wherein each of the first NMOS transistors is turned on or off in response to the pull-up control signal or the first on-die termination control signal, and
the pull-down NMOS driver comprises a predetermined number of second NMOS transistors connected in parallel between the data terminal and the ground voltage, wherein each of the second NMOS transistors is turned on or off in response to the pull-down control signal.

3. The output driver of claim 2, wherein:
the on-die termination controller is enabled in response to a non-target write command or a non-target read command, and receives a second on-die termination control code to generate a second on-die termination control signal in response to the on-die termination enable signal, and
the second NMOS transistors are turned on or off in response to the second on-die termination control signal, and terminate the low-level input data with the ground voltage and terminate the high-level input data with a second high voltage between the first high voltage and the ground voltage.

4. The output driver of claim 3, wherein:
the output driver further comprises a pull-up on-die termination resistor configured to terminate the high-level input data with the first high voltage and terminate the low-level input data with the first low voltage, in response to the first on-die termination control signal, and the pull-up NMOS driver does not respond to the first on-die termination control signal.

5. The output driver of claim 3, wherein:

the output driver further comprises a pull-down on-die termination resistor configured to terminate the low-level input data with the ground voltage and terminate the high-level input data with the second high voltage, in response to the second on-die termination control signal, and the pull-down NMOS driver does not respond to the second on-die termination control signal.

6. A semiconductor memory device comprising:

a command and address generator configured to decode an inverted chip selection signal and a command signal included in a command and address to generate a write command or a read command, and generate an address signal included in the command and address as a row address or a column address;

a latency control signal generator configured to generate an on-die termination enable signal, which is activated using a value of a write latency and inactivated using the value of the write latency and a value of a burst length in response to the write command, and generate a read control signal, which is activated using a value of a read latency and inactivated using the value of the read latency and the value of the burst length in response to the read command;

a memory cell array comprising a plurality of memory cells and configured to receive or output data from/to memory cells selected in response to the row address and the column address;

an on-die termination controller configured to receive a first on-die termination control code to generate a first on-die termination control signal in response to the write command and the on-die termination enable signal;

a pre-driver configured to be enabled in response to the read control signal, and generate a driver control code as a pull-up control signal or a pull-down control signal in response to data which is output from the memory cell array; and a main driver comprising a pull-up n-channel metal-oxide-semiconductor (NMOS) driver and a pull-down NMOS driver, wherein the pull-up NMOS driver is configured to generate high-level output data in response to the pull-up control signal, or terminate high-level input data with a first high voltage which is lower than or equal to an output power supply voltage and terminate low-level input data with a first low voltage between the first high voltage and a ground voltage, in response to the first on-die termination control signal, and the pull-down NMOS driver is configured to generate low-level output data in response to the pull-down control signal.

7. The semiconductor memory device of claim 6, wherein the output power supply voltage applied to the pull-up NMOS driver is lower than or equal to an internal power supply voltage applied to the pre-driver.

8. The semiconductor memory device of claim 7, wherein:

the pull-up NMOS driver comprises a predetermined number of first NMOS transistors connected in parallel between the output power supply voltage and a data terminal, wherein each of the first NMOS transistors is turned on or off in response to the pull-up control signal or the first on-die termination control signal, and the pull-down NMOS driver comprises a predetermined number of second NMOS transistors connected in parallel between the data terminal and the ground voltage, wherein each of the second NMOS transistors is turned on or off in response to the pull-down control signal.

9. The semiconductor memory device of claim 8, wherein:

the command and address generator decodes the command signal to further generate a non-target write command or a non-target read command, the latency control signal generator generates the on-die termination enable signal, which is activated using the value of the write latency and inactivated using the value of the write latency or the value of the read latency and the value of the burst length, in response to the non-target write command or the non-target read command, the on-die termination controller is enabled in response to the non-target write command or the non-target read command, and receives a second on-die termination control code to generate a second on-die termination control signal in response to the on-die termination enable signal, and the second NMOS transistors are turned on or off in response to the second on-die termination control signal, and terminate the low-level input data with the ground voltage and terminate the high-level input data with a second high voltage between the first high voltage and the ground voltage.

10. The semiconductor memory device of claim 9, wherein the first high voltage is a voltage obtained by subtracting a threshold voltage of one of the first NMOS transistors from the output power supply voltage.

11. The semiconductor memory device of claim 9, wherein:

the semiconductor memory device further comprises a pull-up on-die termination resistor configured to terminate the high-level input data with the first high voltage and terminate the low-level input data with the first low voltage, in response to the first on-die termination control signal, and the pull-up NMOS driver does not respond to the first on-die termination control signal.

12. The semiconductor memory device of claim 11, wherein the pull-up on-die termination resistor comprises a predetermined number of third NMOS transistors connected in parallel between the output power supply voltage and the data terminal.

13. The semiconductor memory device of claim 11, wherein the pull-up on-die termination resistor comprises a predetermined number of p-channel metal-oxide-semiconductor (PMOS) transistors connected in parallel between the output power supply voltage and the data terminal.

14. The semiconductor memory device of claim 9, wherein:

the semiconductor memory device further comprises a pull-down on-die termination resistor configured to terminate the low-level input data with the ground voltage and terminate the high-level input data with the second high voltage, in response to the second on-die termination control signal, and the pull-down NMOS driver does not respond to the second on-die termination control signal.

15. The semiconductor memory device of claim 14, wherein:
the command and address generator decodes the command signal to generate a mode setting command,
the semiconductor memory device further comprises a mode setting register configured to set the write latency, the burst length, the read latency, the first on-die termination control code, the second on-die termination control code, and the driver control code in response to the mode setting command, and
the pull-down on-die termination resistor comprises a predetermined number of fourth NMOS transistors connected in parallel between the data terminal and the ground voltage.

16. A memory system comprising:
a first inverted chip selection signal line, a second inverted chip selection signal line, a command and address line, and a data line configured to transmit a first inverted chip selection signal, a second inverted chip selection signal, a command and address, and data, respectively;
a first memory configured to receive the first inverted chip selection signal and the command and address, and receive or output the data; and
a second memory configured to receive or output the second inverted chip selection signal, the command and address, and the data,
wherein each of the first memory and the second memory comprises:
a command and address generator configured to decode the first inverted chip selection signal or the second inverted chip selection signal and a command signal included in the command and address to generate a write command or a read command, and generate an address signal included in the command and address as a row address or a column address,
a latency control signal generator configured to generate an on-die termination enable signal, which is activated using a value of a write latency and inactivated using the value of the write latency and a value of a burst length in response to the write command, and generate a read control signal, which is activated using a value of a read latency and inactivated using the value of the read latency and the value of the burst length in response to the read command,
a memory cell array comprising a plurality of memory cells and configured to receive or output data from/to memory cells selected in response to the row address and the column address,
an on-die termination controller configured to receive a first on-die termination control code to generate a first on-die termination control signal in response to the write command and the on-die termination enable signal,
a pre-driver configured to be enabled in response to the read control signal receive a driver control code to generate a pull-up control signal or a pull-down control signal in response to data which is output from the memory cell array, and a main driver comprising a pull-up n-channel metal-oxide-semiconductor (NMOS) driver and a pull-down NMOS driver,
wherein the pull-up NMOS driver is configured to generate high-level output data in response to the pull-up control signal, or terminate high-level input data with a first high voltage which is lower than or equal to an output power supply voltage and terminate low-level input data with a first low voltage between the first high voltage and a ground voltage, in response to the first on-die termination control signal, and
the pull-down NMOS driver is configured to generate low-level output data in response to the pull-down control signal.

17. The memory system of claim 16, wherein the output power supply voltage applied to the pull-up NMOS driver is lower than or equal to an internal power supply voltage applied to the pre-driver.

18. The memory system of claim 17, wherein:
the pull-up NMOS driver comprises a predetermined number of first NMOS transistors connected in parallel between the output power supply voltage and a data terminal, wherein each of the first NMOS transistors is turned on or off in response to each bit of the pull-up control signal or the first on-die termination control signal, and
the pull-down NMOS driver comprises a predetermined number of second NMOS transistors connected in parallel between the data terminal and the ground voltage, wherein each of the second NMOS transistors is turned on or off in response to each bit of the pull-down control signal.

19. The memory system of claim 18, wherein:
the command and address generator decodes the first inverted chip selection signal or the second inverted chip selection signal and decodes the command signal to further generate a non-target write command or a non-target read command,
the latency control signal generator generates the on-die termination enable signal, which is activated using the value of the write latency and inactivated using the value of the write latency and the value of the burst length, when the non-target write command is generated, and generates the on-die termination enable signal, which is activated using the value of the read latency and inactivated using the value of the read latency and the value of the burst length, when the non-target read command is generated,
the on-die termination controller generates a second on-die termination control code as a second on-die termination control signal in response to the non-target write command or the non-target read command and in response to the on-die termination enable signal, and
the pull-down NMOS driver terminates the low-level input data applied through the data terminal with the ground voltage and terminates the high-level input data with a second high voltage between the first high voltage and the ground voltage in response to the second on-die termination control signal.

* * * * *